(12) United States Patent
Mizuhara

(10) Patent No.: US 7,943,860 B2
(45) Date of Patent: May 17, 2011

(54) MATERIAL BOARD FOR PRODUCING HYBRID CIRCUIT BOARD WITH METALLIC TERMINAL PLATE AND METHOD FOR PRODUCING HYBRID CIRCUIT BOARD

(75) Inventor: Seitaro Mizuhara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 1039 days.

(21) Appl. No.: 11/663,699

(22) PCT Filed: Aug. 9, 2005

(86) PCT No.: PCT/JP2005/014564
§ 371 (c)(1),
(2), (4) Date: Mar. 23, 2007

(87) PCT Pub. No.: WO2006/035551
PCT Pub. Date: Apr. 6, 2006

(65) Prior Publication Data
US 2008/0149380 A1 Jun. 26, 2008

(30) Foreign Application Priority Data

Sep. 28, 2004 (JP) ................................. 2004-282583

(51) Int. Cl.
*H05K 1/11* (2006.01)
(52) U.S. Cl. ........ 174/261; 174/250; 174/255; 174/260; 174/262; 174/535; 361/777; 361/784; 29/846; 29/592; 29/825
(58) Field of Classification Search .................. 174/261, 174/250, 255, 260, 262, 535; 361/784, 777; 29/846, 592, 825
See application file for complete search history.

(56) References Cited

U.S. PATENT DOCUMENTS

| 4,635,354 A | * | 1/1987 | Chrobak et al. | ................. | 29/622 |
| 4,729,165 A | * | 3/1988 | Fahrenschon | ................... | 29/846 |
| 5,067,229 A | * | 11/1991 | Nakamura | ................... | 29/566.1 |

(Continued)

FOREIGN PATENT DOCUMENTS
JP 5-69972 9/1993
(Continued)

*Primary Examiner* — Jinhee Lee
*Assistant Examiner* — Xiaoliang Chen
(74) *Attorney, Agent, or Firm* — Hamre, Schumann, Mueller & Larson, P.C.

(57) ABSTRACT

A material board for producing a hybrid circuit board includes a plurality of hybrid circuit board sections 1 on each of which an electronic component 2 is mounted and a metallic terminal plate 3 for external connection is bonded so as to project from the hybrid circuit board section. A frame portion 6 is defined between the hybrid circuit board sections, and the hybrid circuit board sections are integrally connected to the frame portion via a thin strip 8 provided at an intermediate portion of grooves 7 each surrounding a respective one of the hybrid circuit board sections entirely. In bonding the terminal plate 3 to the hybrid circuit board by soldering, the terminal plate is temporarily bonded to the frame portion 6 with an adhesive 9. The adhesive is prevented from spreading toward the end of the terminal plate. A hole or a recess 10 is formed in the frame portion 6 at a region with which the terminal plate 3 is to overlap and which is closer to an end of the terminal plate than a portion to which the adhesive 9 for temporarily bonding the terminal plate to the frame portion is to be applied is.

2 Claims, 4 Drawing Sheets

U.S. PATENT DOCUMENTS

| | | | |
|---|---|---|---|
| 5,150,087 A * | 9/1992 | Yoshie et al. | 333/185 |
| 5,798,638 A * | 8/1998 | Mendolia | 324/158.1 |
| 6,028,489 A * | 2/2000 | Juang et al. | 331/46 |
| 6,114,760 A * | 9/2000 | Kim et al. | 257/697 |
| 6,239,380 B1 * | 5/2001 | Drussel et al. | 174/250 |
| 6,324,068 B1 * | 11/2001 | Shimizu et al. | 361/777 |
| 6,555,015 B1 * | 4/2003 | Dailey et al. | 216/17 |
| 6,769,166 B1 * | 8/2004 | Blanchard | 29/595 |
| 7,095,922 B2 * | 8/2006 | Fukuyama et al. | 385/33 |
| 7,279,063 B2 * | 10/2007 | Yokajty et al. | 156/275.5 |

FOREIGN PATENT DOCUMENTS

| | | |
|---|---|---|
| JP | 9-237848 | 9/1997 |
| JP | 11-233927 | 8/1999 |
| JP | 2000-31611 | 1/2000 |

\* cited by examiner

MATERIAL BOARD FOR PRODUCING HYBRID CIRCUIT BOARD WITH METALLIC TERMINAL PLATE AND METHOD FOR PRODUCING HYBRID CIRCUIT BOARD

TECHNICAL FIELD

The present invention relates to a material board for producing a hybrid circuit board on which an electronic component is mounted and to which a metallic terminal plate for external connection is bonded to project outward. The invention also relates to a method for manufacturing such a hybrid circuit board.

BACKGROUND ART

Conventionally, a hybrid circuit board on which an electronic component is mounted and a metallic terminal plate for external connection is bonded to project outward is formed by such a method as disclosed in e.g. Patent Document, which is as follows.

A plurality of hybrid circuit boards are formed in a material board having a size for producing a plurality of hybrid circuit boards. Specifically, the hybrid circuit boards are so formed that a frame portion is defined between the hybrid circuit boards and that the hybrid circuit boards are integrally connected to the frame portion via a thin strip provided at an intermediate portion of grooves each surrounding a respective one of the hybrid circuit boards entirely. A terminal plate made of metal is placed at a predetermined position of each of the hybrid circuit boards so that an end of the terminal plate projects onto the frame portion. After the base portion of each of the terminal plates is bonded to the hybrid circuit board by soldering, the hybrid circuit board is separated from the material board by cutting the thin strip.

In the above-described conventional manufacturing method, when a terminal plate is placed on each of the hybrid circuit boards of the material plate, the end of the terminal plate which projects out from the hybrid circuit board to overlap the frame portion is temporarily bonded to the frame portion detachably with an adhesive. In this way, the terminal plate is prevented from moving before the terminal plate is fixed by soldering. After the terminal plate is soldered with the position fixed, the temporarily bonded portion is detached, and each of the hybrid circuit boards is separated from the material board.

Patent Document 1: JP-A-2000-31611

DISCLOSURE OF THE INVENTION

Problems to be Solved by the Invention

In the above-described manufacturing method, the end of a terminal plate placed on each of the hybrid circuit board is temporarily bonded to the frame portion surrounding the hybrid circuit board detachably with an adhesive. The adhesive used for the temporary bonding may spread by the capillary phenomenon and adhere to the surface of the end of the terminal plate. Therefore, when a wire from the external or to the external is to be electrically connected to the end of the terminal plate by e.g. soldering, electrical connection failure is liable to occur. Further, since the adhesive spreads due to the capillary phenomenon, the bonding area increases. As a result, it may become considerably difficult or impossible to later detach the temporarily bonded portion.

The technical objects of the present invention is to provide a material board for producing a hybrid circuit board and a method for manufacturing a hybrid circuit board which are capable of solving the above-described problems.

Means for Solving the Problems

To achieve the technical objects, a material board for producing a hybrid circuit board according to the present invention comprises a plurality of hybrid circuit board sections on each of which an electronic component is mounted and a metallic terminal plate for external connection is bonded to project from the hybrid circuit board section, a frame portion being defined between the hybrid circuit board sections, and the hybrid circuit board sections being integrally connected to the frame portion via a thin strip provided at an intermediate portion of grooves each surrounding a respective one of the hybrid circuit board sections entirely.

A hole or a recess is formed in the frame portion at a region with which the terminal plate is to overlap and which is closer to an end of the terminal plate than a portion to which an adhesive for temporarily bonding the terminal plate to the frame portion is to be applied is.

A method for manufacturing a hybrid circuit board according to the present invention comprises at least the steps of: forming, in a material board, a plurality of hybrid circuit board sections, on each of which an electronic component is mounted, so that a frame portion is defined between the hybrid circuit board sections and the hybrid circuit board sections are integrally connected to the frame portion via a thin strip provided at an intermediate portion of grooves each surrounding a respective one of the hybrid circuit board sections entirely; placing an external connection metallic terminal plate onto each of the hybrid circuit board sections so that the metallic terminal plate partially projects toward the frame portion and temporarily bonding the metallic terminal plate to the frame portion with an adhesive; bonding the terminal plate to the hybrid circuit board section by soldering; and detaching the temporarily bonded portion of the terminal plate and cutting the thin strip to separate the hybrid circuit board section from the material board.

The method further comprises the step of forming a hole or a recess in the frame portion at a region with which the terminal plate is to overlap and which is closer to an end of the terminal plate than a portion to which the adhesive for temporarily bonding the terminal plate to the frame portion is to be applied is, the hole or recess forming step being performed before the step of temporarily bonding the terminal plate to the frame portion.

Advantages of the Invention

As described above, in the frame portion around the hybrid circuit board, a hole or a recess is formed at a region with which the terminal plate is to overlap and which is closer to an end of the terminal plate than a portion to which an adhesive for temporarily bonding the terminal plate to the frame portion is to be applied is. Therefore, part of the temporary bonding adhesive spreading toward the end of the terminal plate flows into the hole or the recess. Therefore, the spreading of the temporary bonding adhesive toward the end of the terminal plate can be reliably prevented by the hole or the recess.

According to the present invention, therefore, when a wire from the external or to the external is to be electrically connected to the end of the terminal plate by e.g. soldering, electrical connection failure due to the adhesive for temporarily bonding the terminal plate to the frame portion can be prevented. Further, the detachment of the temporarily bonded portion is prevented from becoming considerably difficult or impossible.

In addition to the above-described hole or recess, an auxiliary hole or a recess may be formed in the frame portion at a region which is opposite from the hole or recess across the portion to which the adhesive is to be applied. With this arrangement, the spreading of the adhesive can be restricted within the area between the hole or recess and the auxiliary hole or recess so that the adhesive spreads in the lateral direction. Therefore, the bonding area necessary for the temporary bonding can be reliably secured.

Figure 1:
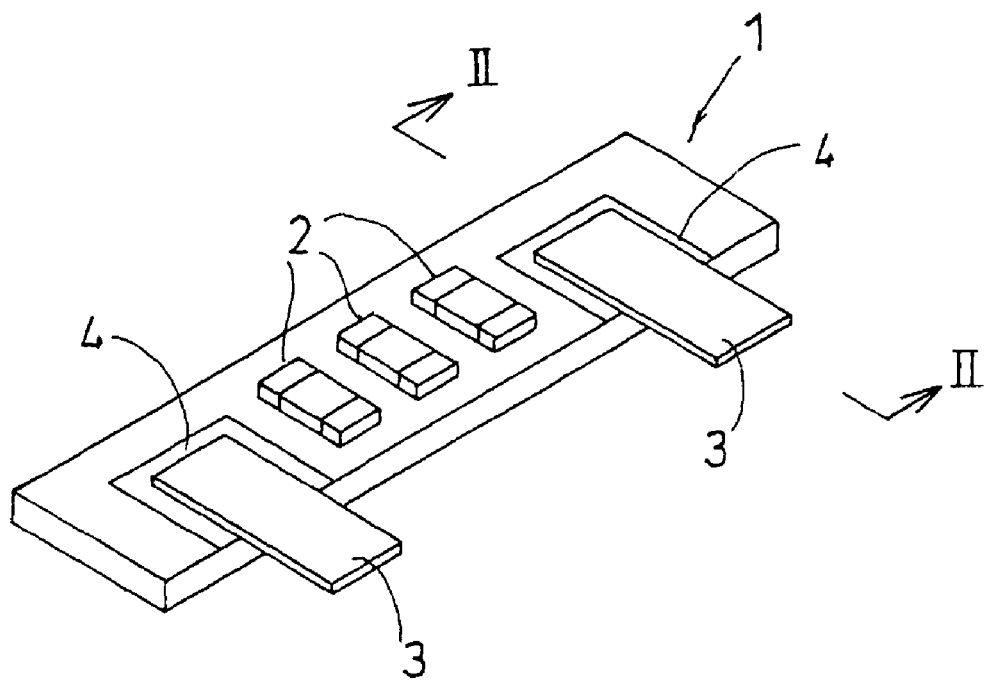
FIG. 1 is a perspective view of a hybrid circuit board.

Description of Signs 1 hybrid circuit board
2 electronic component
3 terminal plate
4 electrode pad
5 material board
6 frame portion
7 groove
8 thin strip
9 adhesive
10 hole
11 auxiliary hole

BEST MODE FOR CARRYING OUT THE INVENTION

Preferred embodiments of the present invention will be described below with reference to the accompanying drawings.

Figure 2:
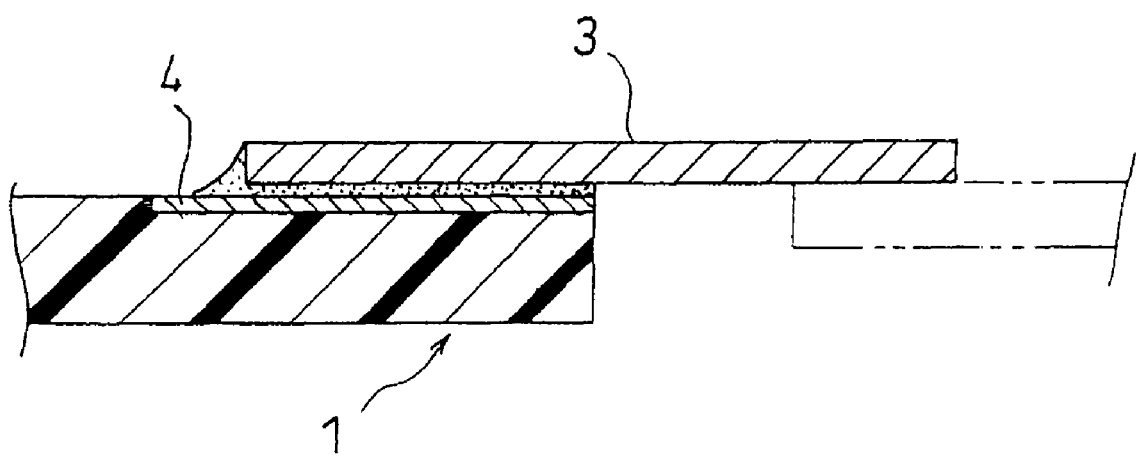
FIG. 2 is a sectional view taken along lines II-II in FIG. 1.

FIGS. 1 and 2 show a hybrid circuit board 1 according to the present invention. On the hybrid circuit board 1, a plurality of electronic components 2 each in the form of a chip are mounted. Further, on each of the electrode pads 4 formed on the hybrid circuit board 1, an external connection terminal plate 3 made of metal is bonded by soldering the base portion of the terminal plate so that the end of the terminal plate projects from the hybrid circuit board 1.

Figure 3:
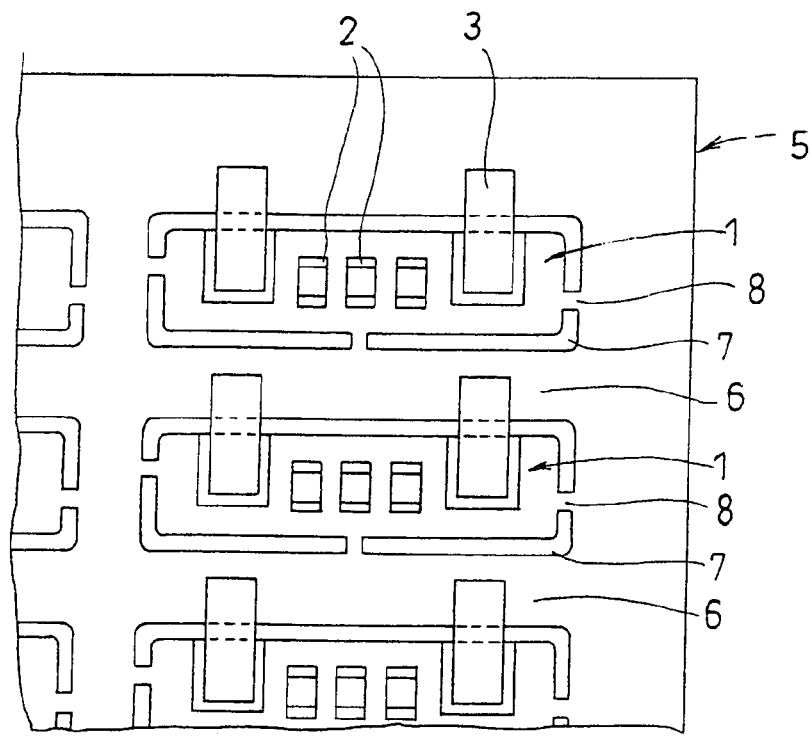
FIG. 3 is a plan view of a material board.
Figure 4:
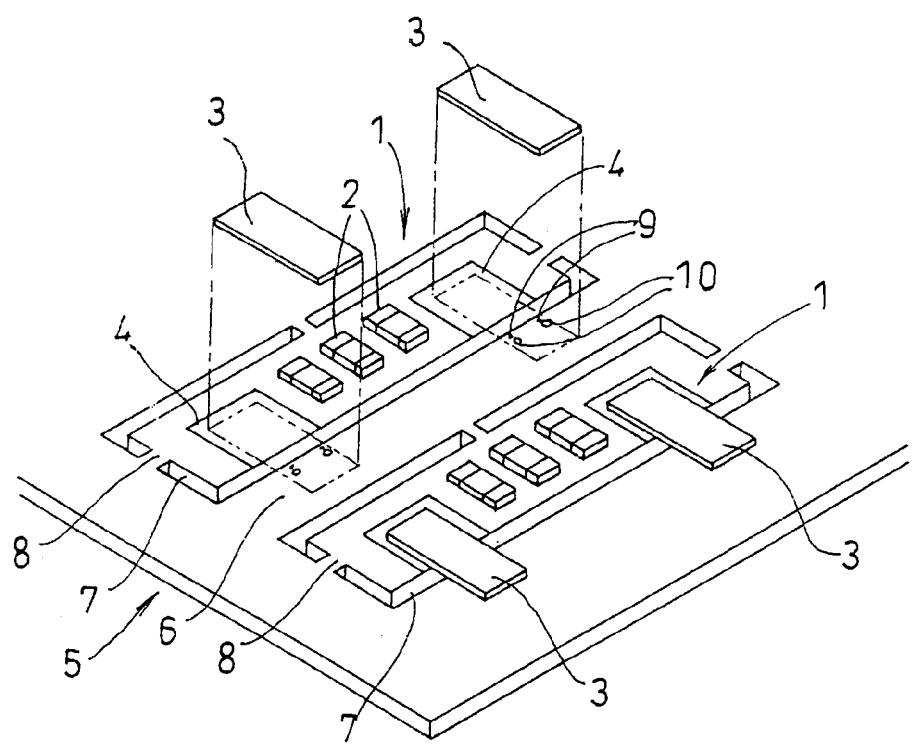
FIG. 4 is a perspective view of the material board.

To manufacture the hybrid circuit board 1 having the above-described structure, a material board 5 that is large enough to produce a plurality of hybrid circuit boards 1 is prepared, as shown in FIGS. 3 and 4.

Subsequently, a plurality of hybrid circuit boards 1 are formed on the material board 5 so that a frame portion 6 is defined between the hybrid circuit boards 1. The hybrid circuit boards 1 are integrally connected to the frame portion 6 via a plurality of thin strips 8 provided at intermediate portions of each of grooves 7 respectively surrounding the hybrid circuit boards 1 entirely.

Subsequently, in each of the hybrid circuit boards 1, solder paste (not shown) is applied to each of electrode pads 4 formed on the hybrid circuit board. Thereafter, a terminal plate 3 made of metal is so placed on the electrode pad that the portion of the terminal plate 3 which projects out from the hybrid circuit board 1 overlaps the frame portion 6.

Before placing the terminal plate 3, quick-drying adhesive 9 for temporary bonding is applied to the lower surface of the terminal plate 3 at two sites that overlap the frame portion 6, or applied to the upper surface of the frame portion 6 at two sites that are overlapped by the terminal plate 3. As a result, the terminal plate 3 is temporarily bonded to the frame portion 6 with the adhesive 9 in a detachable manner.

Figure 5:
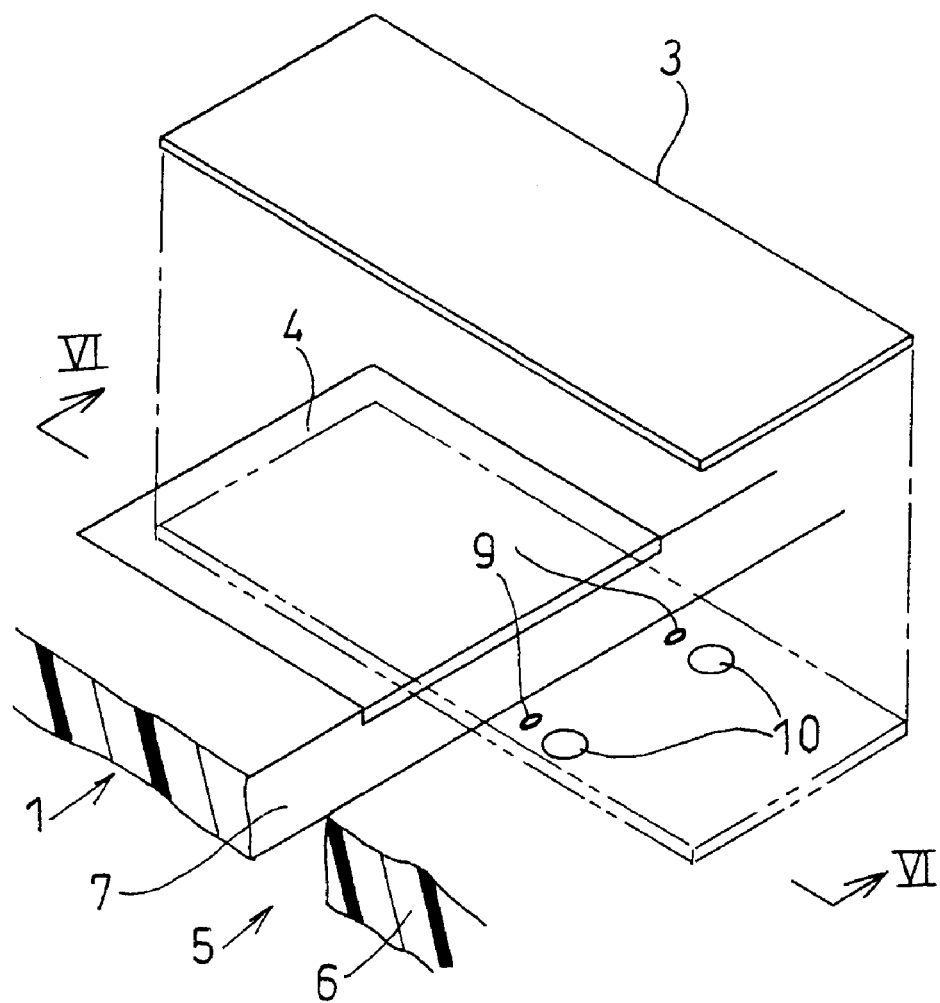
FIG. 5 is an enlarged perspective view of a principal portion of FIG. 4.
Figure 6:
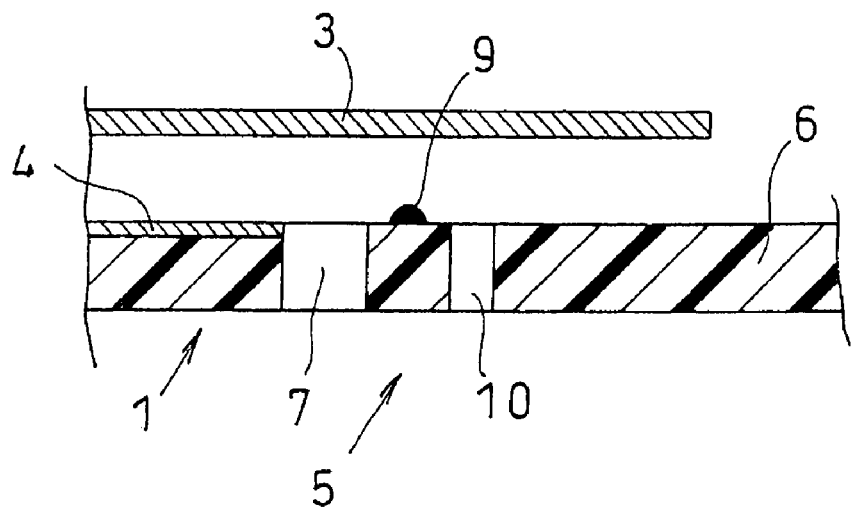
FIG. 6 is a sectional view taken along lines VI-VI in FIG. 5.

As shown in FIGS. 5 and 6, before the adhesive 9 is applied, holes 10 are formed at opposite sides of the portion of the frame portion 6 with which the terminal plate 3 is to overlap and which is adjacent to the groove 7 surrounding the hybrid circuit board 1 entirely. The adhesive 9 is applied between the holes 10 and the groove 7.

In this way, part of the temporary bonding adhesive 9 spreading toward the end of the terminal plate 3 flows into the holes 10. Therefore, the spreading of the temporary bonding adhesive 9 toward the end of the terminal plate 3 can be reliably prevented by the holes 10.

Instead of applying the temporary bonding adhesive 9 to the frame portion 6 of the material board 5, the adhesive may be applied to the terminal plate 3. Further, instead of the holes 10, recesses may be formed. In this case again, the spreading of the adhesive 9 toward the end can be prevented.

After the terminal plate 3 is placed on each of the hybrid circuit boards 1 of the material board 5 and the terminal plate 3 is temporarily bonded to the frame portion 6, a soldering process is performed. Specifically, the soldering is performed by heating the entirety of the material board 5 so that the solder paste melts and then cooling the material board. In this way, the base portion of each of the terminal plates 3 is soldered to the electrode pad 4 of the corresponding hybrid circuit board 1.

Subsequently, by cutting each of the thin strip portions 8 and detaching the temporarily bonded portion of the terminal plate 3, each of the hybrid circuit boards 1 is separated from the material board 5.

Figure 7:
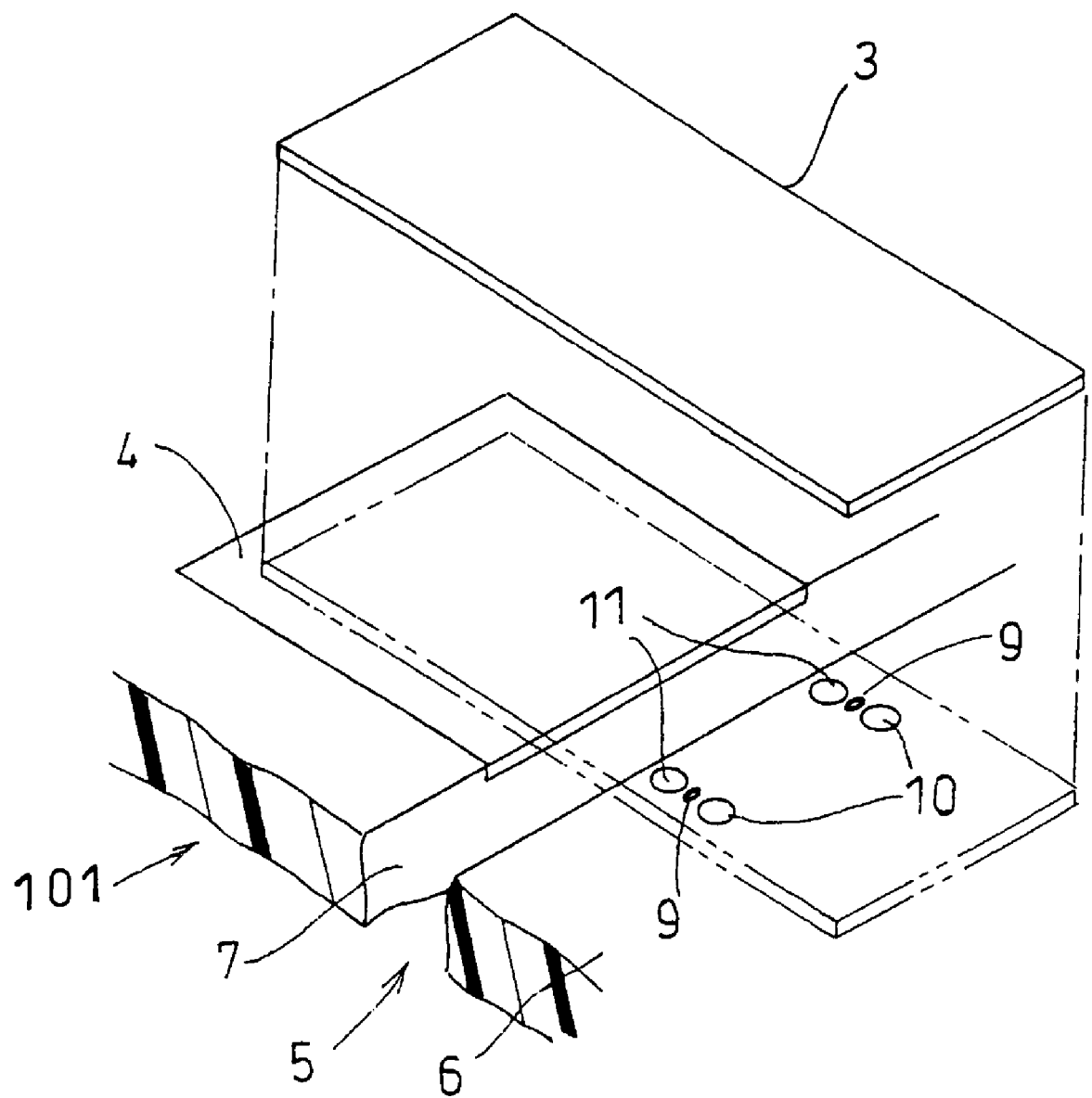
FIG. 7 is a perspective view showing a principal portion of a second embodiment.

FIG. 7 shows a second embodiment of the present invention.

In the hybrid circuit board 101 of the second embodiment, in addition to the above-described holes 10 or the recesses, auxiliary holes 11 are formed on the opposite sides of the holes 10 across the portions to which the adhesive 9 is to be applied.

With this arrangement, the spreading of the adhesive 9 can be restricted within the area between the holes 10 or recesses and the auxiliary holes 11 so that the adhesive 9 spreads in the lateral direction.

Instead of the auxiliary holes 11, auxiliary recesses may be formed.

The invention claimed is:
1. A material board for producing a hybrid circuit board provided with a metallic terminal plate, the material board comprising a plurality of hybrid circuit board sections on each of which an electronic component is mounted and a metallic terminal plate for external connection is bonded to project from the hybrid circuit board section in a predetermined projection direction, a frame portion being defined between the hybrid circuit board sections, and the hybrid circuit board sections being integrally connected to the frame portion via a thin strip provided at an intermediate portion of grooves each surrounding a respective one of the hybrid circuit board sections entirely,
wherein a first pair of holes and a second pair of holes are formed in the frame portion at a region with which the terminal plate is to overlap and which is close to one of the grooves, the first pair and the second pair are spaced away from each other in a direction crossing the projection direction, the holes of the first pair are spaced away from each other in the projection direction, the holes of the second pair are spaced away from each other in the projection direction, and an adhesive for temporarily bonding the terminal plate to the frame portion is applied between the holes of the first pair and also between the holes of the second pair, wherein each of the holes has a circular cross section, and the adhesive is applied to an area smaller than the cross section of each hole.

2. A method for manufacturing a hybrid circuit board provided with a metallic terminal plate, the method comprising the steps of:

forming, in a material board, a plurality of hybrid circuit board sections, on each of which an electronic component is mounted, so that a frame portion is defined between the hybrid circuit board sections and the hybrid circuit board sections are integrally connected to the frame portion via a thin strip provided at an intermediate portion of grooves each surrounding a respective one of the hybrid circuit board sections entirely;

placing an external connection metallic terminal plate onto each of the hybrid circuit board sections so that the metallic terminal plate partially projects in a predetermined projection direction toward the frame portion and temporarily bonding the metallic terminal plate to the frame portion with an adhesive;

bonding the terminal plate to the hybrid circuit board section by soldering; and detaching the temporarily bonded portion of the terminal plate and cutting the thin strip to separate the hybrid circuit board section from the material board;

wherein the method further comprises the step of forming a first pair of holes and a second pair of holes in the frame portion at a region with which the terminal plate is to overlap and which is close to one of the grooves, the hole forming step being performed before the step of temporarily bonding the terminal plate to the frame portion, wherein the first pair and the second pair are spaced away from each other in a direction crossing the projection direction, the holes of the first pair are spaced away from each other in the projection direction, the holes of the second pair are spaced away from each other in the projection direction, and the adhesive is applied between the holes of the first pair and also between the holes of the second pair, wherein each of the holes has a circular cross section, and the adhesive is applied to an area smaller than the cross section of each hole.

* * * * *